United States Patent [19]
Roberts et al.

[11] Patent Number: 5,923,672
[45] Date of Patent: Jul. 13, 1999

[54] MULTIPATH ANTIFUSE CIRCUIT

[75] Inventors: Gordon D. Roberts; Jeffrey D. Bruce, both of Meridian; Kurt D. Beigel; Eric T. Stubbs, both of Boise, all of Id.

[73] Assignee: Micron Technology, Inc., Boise, Id.

[21] Appl. No.: 08/870,085

[22] Filed: Jun. 4, 1997

[51] Int. Cl.[6] .................................................. G06F 11/00
[52] U.S. Cl. ............................................................ 371/10.2
[58] Field of Search ................................. 371/10.2, 10.3, 371/21.1, 21.4, 21.6; 365/201

[56] References Cited

U.S. PATENT DOCUMENTS 5,255,227  10/1993  Haeffele .................................... 371/21

Primary Examiner—Vincent P. Canney
Attorney, Agent, or Firm—Seed and Berry LLP

[57] ABSTRACT

An address detection circuit includes for each bit to be detected, a plurality of antifuse legs connected in parallel. Each of the antifuse legs includes a separate isolation transistor, so that each of the antifuse legs can be separately disabled. For blowing, only one of the antifuse legs is enabled at a time. During conventional operation, all of the antifuse legs are enabled so that the overall resistance of the antifuse legs equals the parallel combination of the resistances of the blown antifuses. Because the parallel combination of the blown antifuses is always less than or equal to the lower of the resistances of the antifuses, only one of the antifuses need be blown properly for the parallel combination to operate properly.

27 Claims, 3 Drawing Sheets

MULTIPATH ANTIFUSE CIRCUIT

TECHNICAL FIELD

The present invention relates to integrated circuit devices, and more particularly, to antifuse circuits in integrated devices.

BACKGROUND OF THE INVENTION

Typical integrated memory devices include arrays of memory cells arranged in rows and columns. In many such memory arrays, several redundant rows and columns are provided to be used as substitutes for defective locations in memory. When a defective bit location is identified, rather than treating the entire array as defective, a redundant row or column is substituted for the row or column containing the defective bit location. This substitution is performed by assigning the address of the defective row or column to the redundant row or column such that, when an address corresponding to the defective row or column is received, the redundant row or column is addressed instead.

To make substitution of the redundant row or column substantially transparent to a system employing the memory circuit, the memory circuit includes an address detection circuit. The address detection circuit monitors the row and column addresses and, when the address of a defective row or column is received, enables the redundant row or column instead.

One type of address detection circuit is a fuse-bank address detection circuit. Fuse-bank address detection circuits employ a bank of sense lines where each sense line corresponds to a bit of an address. The sense lines are programmed by blowing fuses in the sense lines in a pattern corresponding to the address of the defective row or column. Addresses are then detected by first applying a test voltage across the bank of sense lines. Then, bits of the address are applied to the sense lines. If the pattern of blown fuses corresponds exactly to the pattern of address bits, the sense lines all block current and the voltage across the bank remains high. Otherwise, at least one sense line conducts and the voltage falls. A high voltage thus indicates the programmed address has been detected. A low voltage indicates a different address has been applied.

Typically, the fuses are blown by laser cutting the fuse conductors to remove the conductive paths through the fuses. One problem with such an approach is that laser cutting of the fuses is time consuming, difficult, and imprecise. As a consequence, the cost and reliability of memory devices employing fuse bank circuits can be less than satisfactory.

To eliminate the cost, difficulty, and expense of laser cutting, memory devices have recently been developed that employ antifuses in place of conventional fuses. Antifuses are capacitive-type structures that, in their unblown states, form open circuits. Antifuses may be "blown" by applying a high voltage across the antifuse. The high voltage causes the capacitive-type structure to break down, forming a conductive path through the antifuse. Therefore, blown antifuses conduct and unblown antifuses do not conduct.

Typically, the high voltage for blowing antifuses comes from a single voltage source applied to several antifuses simultaneously so that the antifuses can be blown in groups. Due to variations among the individual antifuses, the response to the high voltage may vary significantly across a particular group. For example, some of the antifuses may blow quickly while other, more robust, antifuses may take significantly longer to blow.

As the less robust antifuses blow, they begin to draw current from the high voltage source. The cumulative current draw of the less robust antifuses can be sufficient to significantly load the high voltage source. Consequently, the output voltage of the high voltage source may drop before the more robust antifuses are blown. In some cases, the voltage can drop to a low enough level that the more robust antifuses remain unblown or are only partially blown. As a consequence, the pattern of blown antifuses will not correspond to the appropriate address, and the address detection circuit will not accurately indicate the appropriate address.

One approach to this current-loading problem is to limit the number of antifuses in each group so that the cumulative current draw of the antifuses will be insufficient to pull down the high voltage. However, reducing the number of antifuses in the groups slows the process of blowing the antifuses, thereby decreasing the efficiency with which the memory circuits can be produced.

Another approach is to provide a strong high voltage source that can maintain the high voltage even when loaded by the blown antifuses. Such voltage sources can be difficult to provide, especially when some of their switching circuitry is integrated into the memory device. Moreover, to ensure that the more robust antifuses are blown, the high voltage is still applied for an extended period. Consequently, programming time is increased undesirably.

SUMMARY OF THE INVENTION

An antifuse circuit includes a bank of sense lines each including a plurality of antifuses coupled in parallel. In the preferred embodiment, each of the sense lines includes two antifuses. A first of the antifuses is serially coupled to a respective isolation switch so that the first antifuse can be electrically isolated. In one embodiment, a second antifuse is also coupled to a respective isolation switch, so that either of the antifuses can be electrically isolated.

The antifuse pair is coupled between a test node and a reference circuit that provides either a reference voltage or a blowing voltage. A select transistor is coupled between the test node and a reference potential to allow the test node to be selectively grounded. A biasing circuit is also coupled between a supply voltage and the test node to bias the test node during normal operation.

During testing, the isolation switches are closed so that the antifuses are coupled in parallel between the test node and the reference circuit. The reference circuit provides a reference voltage, so that if the antifuses are blown, the antifuses provide a conductive path from the test node to the reference potential. The select transistor is OFF and provides no path to the reference potential. Because both of the antifuses are coupled in parallel the total resistance between the test node and the reference circuit is equal to the parallel resistance of the two antifuses. If the antifuses are unblown, the antifuses isolate the test node from the reference circuit, and the biasing circuit raises test node voltage. If the antifuses are blown, their conductivity overcomes the biasing circuit to pull the node voltage down to about the reference potential.

To blow the antifuses, the select transistor is turned ON and the reference circuit provides a blowing voltage. Blowing is performed in two stages where, during the first stage, the first isolation switch is closed and the second isolation switch is open. Thus, during the first stage, the second antifuse is isolated and the blowing voltage blows only the first antifuse in the pair. During the second stage of blowing, the first isolation switch is open and the second isolation switch is closed, so that the first antifuse is isolated and the second antifuse is blown.

After the second stage is complete, both of the isolation switches are closed so that the two antifuses are coupled in parallel. Because the antifuses in each pair are then connected in parallel, the overall resistance of the two antifuse combination will be less than or equal to the lower of the resistances of the two antifuses. Consequently, if one of the antifuses in the pair is insufficiently blown so that its resistance is greater than the desired maximum, the overall resistance of the antifuse pair can still be less than the desired maximum value.

In a fuse bank according to one embodiment of the invention, each of the antifuse pairs forms one sense leg of an antifuse bank. As is conventional, more than one sense leg may be programmed simultaneously. Thus, during the first stage described above, a plurality of antifuses are programmed according to a selected bit pattern. Then, during the second stage, the parallel counterparts of the blown antifuses are blown simultaneously.

DETAILED DESCRIPTION OF THE INVENTION

Figure 1:
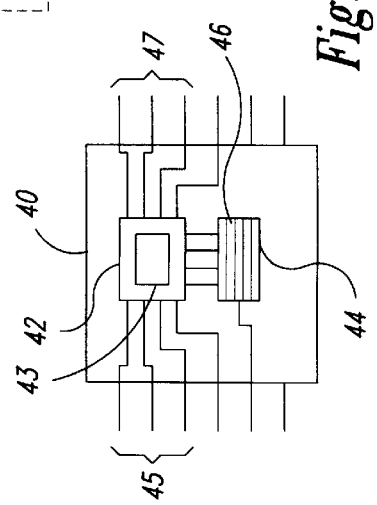
FIG. 1 is a diagram of an integrated circuit device including a primary integrated circuit and a secondary circuit including a plurality of antifuse banks.

As shown in FIG. 1, a memory device 40 includes a primary circuit 42 and an auxiliary circuit 44. The primary circuit 42 includes a conventional memory array 43 having memory cells arranged in rows and columns where individual cells in the memory array 43 are accessed by addresses provided at address terminals 45. Data is transferred to and from the array 43 from data terminals 47.

The auxiliary circuit 44 includes several antifuse circuits 46 that perform auxiliary functions, such as substituting redundant rows or columns for defective rows or columns. While the primary and auxiliary circuits 42, 44 are shown separately for clarity of presentation, one skilled in the art will recognize that the primary and auxiliary circuits 42, 44 are typically integrated into a common substrate.

Figure 2:
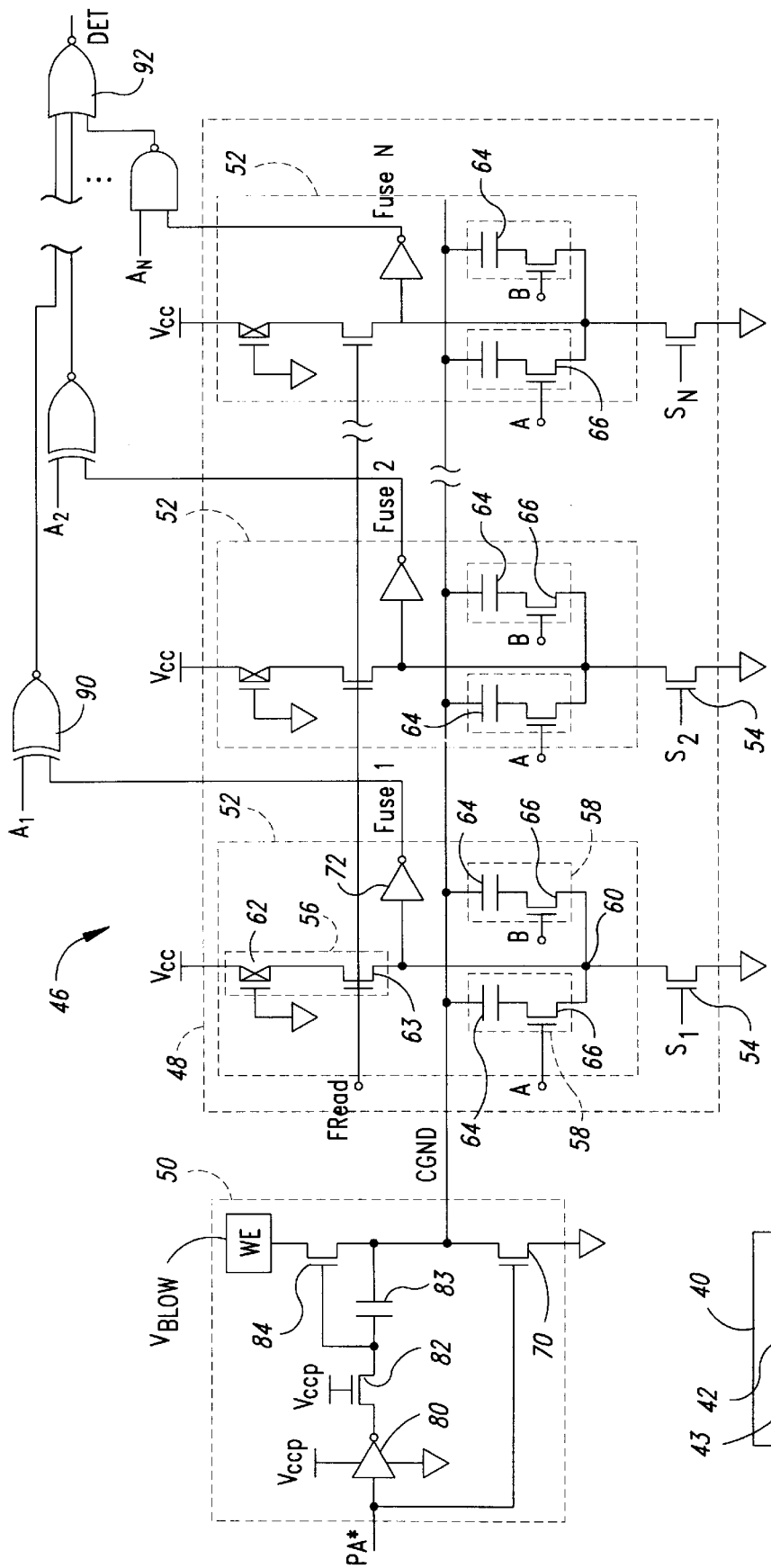
FIG. 2 is a schematic of an antifuse bank circuit including an antifuse bank and a reference circuit.

As shown in FIG. 2, one of the antifuse circuits 46 includes a bank 48 of antifuses 64 coupled to a blowing circuit 50. The antifuse bank 48 is formed from several sense legs 52 coupled between a supply voltage $V_{CC}$ and the blowing circuit 50. The sense legs 52 each include a biasing transistor 62 and read transistor 63 serially connected between the supply voltage $V_{CC}$ and a test node 60. The biasing transistor 62 is a PMOS transistor with a high channel resistance which has its gate coupled to ground so that the biasing transistor 62 acts as a high value resistance between the supply voltage $V_{CC}$ and the read transistor 63. The read transistor 63 is an NMOS transistor having its gate controlled by a reading signal FRead, as will be described below.

Additionally, the sense legs 52 include a parallel pair of fuse legs 58 coupled between the test node 60 and the blowing circuit 50. Each of the fuse legs 58 includes an antifuse 64 and an isolation transistor 66 that are serially coupled. The two fuse legs 58 in each pair are identical, except that the gates of the respective isolation transistors 66 are controlled by separate isolation signals A, B. The separate isolation signals A, B allow each isolation transistor 66 to be opened or closed independently to separately enable its respective antifuse leg 58, as will be described in greater detail below.

The blowing circuit 50 is a conventional blowing circuit that provides a switchable voltage CGND in response to a programming signal PA*. If the programming signal PA* is low, an inverter 80 provides a high voltage through an NMOS regulating transistor 82. The regulating transistor 82 supplies a control voltage $V_{CON}$ ($=V_{CCP}-V_T$) to a boot capacitor 83 and an NMOS control transistor 84.

The control voltage $V_{CON}$ turns ON the control transistor 84 to raise the switchable voltage CGND. The rising switchable voltage CGND raises the voltage on its corresponding plate of the boot capacitor 83, thereby increasing the control voltage $V_{CON}$. The rising control voltage $V_{CON}$ raises the gate voltage of the control transistor 84 above the supply voltage $V_{CCP}$. Since the gate voltage of the control transistor 84 is "bootstrapped" above the supply voltage $V_{CCP}$, the blowing voltage $V_{BLOW}$ can raise the switchable voltage CGND as high as the bootstrapped control voltage $V_{CON}$ minus the threshold voltage $V_T$ of the control transistor 84. The blowing voltage $V_{BLOW}$ may be on the order of 10–20 V and, when applied across an antifuse, can "blow" the antifuse. That is, the blowing voltage $V_{BLOW}$ can convert an antifuse from an open circuit element to a conductive element. During blowing, the low programming signal PA* also turns OFF a reference transistor 70 to isolate the output of the blowing circuit 50 from ground.

If the programming signal PA* is high, the inverter 80 outputs a low voltage to turn OFF the control transistor 84, isolating the output of the blowing circuit 50 from $V_{BLOW}$. At the same time the high programming signal PA* turns ON the reference transistor 70 to ground the output of the blowing circuit 50.

During normal operation of the primary integrated device 42, the programming signal PA* is high so that the switchable voltage CGND is equal to ground. During programming of the antifuse circuit 46, however, the programming signal PA* is low so that the switchable voltage CGND equals the blowing voltage $V_{BLOW}$.

In addition to the above-described circuitry, the antifuse bank 48 also includes select transistors 54 coupled between each of the test nodes 60 and the reference potential. The gates of the select transistors are driven by respective select signals $S_1, S_2 \ldots S_N$ to allow the test nodes 60 to be selectively grounded during blowing of the antifuses 64. The select signals $S_1, S_2, \ldots S_N$ are externally provided signals from a programming station. Where the antifuse circuit 46 is an address detection circuit, the select signals $S_1, S_2 \ldots S_N$ correspond to bits of an address of a defective row or column.

Figure 3:
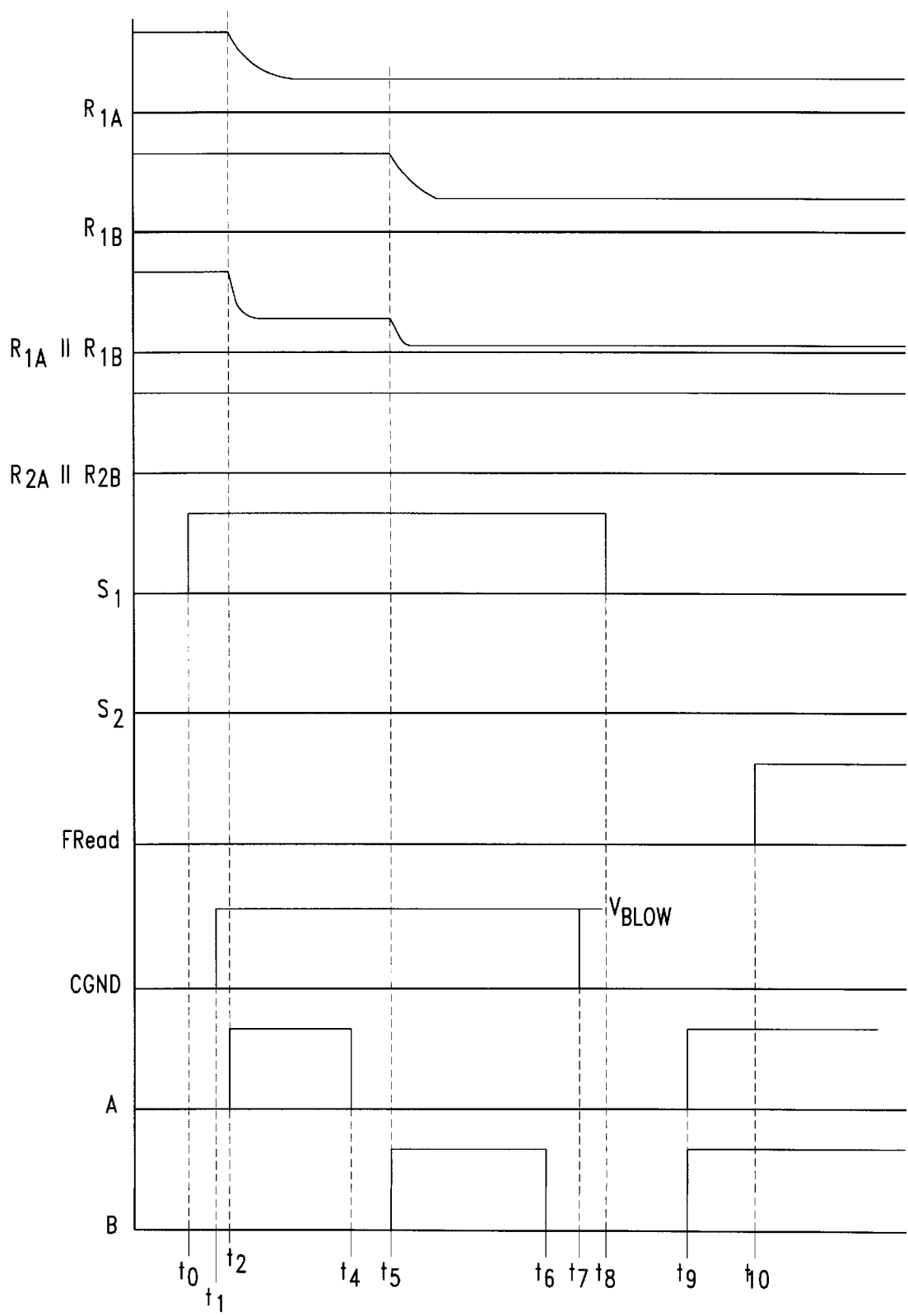
FIG. 3 is a signal timing diagram showing select signals, blowing voltages, and antifuse resistances in the circuit of FIG. 2.

Blowing of the antifuses will be described first with reference to FIG. 3. As shown in the uppermost two graphs of FIG. 3, the resistances $R_{1A}, R_{1B}$ of the antifuses 64 of the first sense leg 52 are initially very high. As shown in the third graph of FIG. 3, because the resistances of the antifuses 64 are both extremely high, the resistance $R_{1A} \| R_{1B}$ of the parallel combination of the antifuses 64 is also very high. One skilled in the art will recognize that, initially, the initial resistances $R_{1A}, R_{1B}$ are substantially infinite, because the antifuses 64 are capacitor-like structures. However, the graphs of the resistances $R_{1A}$, $R_{1B}$, $R_{1A}\|R_{1B}$ are limited in height for convenience of representation. Before blowing, the programming signal PA* is high such that the switchable voltage CGND is ground as shown in the fourth graph of FIG. 3. Additionally, the reading signal FRead is low, as shown in the seventh graph of FIG. 2, thereby isolating the test node 60 from the supply voltage $V_{CC}$.

The blowing process begins at time to when the first select signal $S_1$ goes high, turning ON the first select transistor 54, to couple the first test node 60 to ground. The second select signal $S_2$ remains low to keep the second select transistor 54 OFF and isolate the second test node 60 from ground because the antifuses 64 in the second sense leg 52 are not intended to be blown. At time $t_1$, a short time after the first select signal $S_1$ goes high, the programming signal PA* goes low, setting the switchable voltage CGND equal to the blowing voltage $V_{BLOW}$, as shown in the eight graph of FIG. 3. At this point, the isolation signals A, B are both low, so that the isolation transistors 66 are all OFF. Consequently, the isolation transistors 66 block current flow through their respective antifuses 64, thereby keeping the antifuses 64 from blowing.

Soon thereafter, at time $t_2$, the first isolation signal A goes high, turning ON all of the isolation transistors 66 in the left fuse legs 58. All of the isolation transistors 66 in the right fuse legs 58 remain OFF, because the second isolation signal B remains low.

When the first isolation signal A goes high, the first isolation transistor 66 and first select transistor 54 couple one side of the antifuse 64 to ground. The voltage across the antifuse 64 in the first antifuse leg 58 becomes substantially equal to the blowing voltage $V_{BLOW}$, and the left antifuse 64 begins to blow. As the left antifuse 64 blows, its resistance $R_{1A}$ falls, as shown in the uppermost graph of FIG. 3. The resistance $R_{1A}\|R_{1B}$ of the parallel combination of the first and second antifuses falls correspondingly, as shown in the third graph of FIG. 3.

The left antifuse 64 in the second sense leg 52 does not blow, because the second select transistor 54 blocks current flow through the second sense leg's antifuses 64. Consequently, the blowing voltage does not affect the antifuses 64 in the second sense leg 52, and the resistance $R_{2A}\|R_{2B}$ of the second pair of antifuses 64 remains high, as shown in the fourth graph of FIG. 3.

Similarly, the OFF isolation transistor 66 in the right fuse leg 58 of the first sense leg 52 blocks current flow through the right antifuse 64. Thus, the resistance $R_{1B}$ of the right antifuse 64 remains extremely high.

At time $t_4$, the first isolation signal A returns low, once again isolating the antifuses 64 in the left antifuse legs 58 of all of the sense legs 52. A short time later at time $t_5$, the second isolation signal B goes high, thereby turning ON the isolation transistors 66 in the right fuse legs 58 of each of the sense legs 52. In the selected sense legs 52, both the isolation transistors 66 and select transistors 54 are ON, so that the selected antifuses 64 are coupled to ground. The blowing voltage $V_{BLOW}$ blows the antifuses 64 in the right antifuse leg 58 of the first sense leg 52, thereby decreasing the resistance $R_{1B}$, as shown in the second graph of FIG. 3. The parallel resistance of the antifuses 64 (as would be measured if the isolation transistors 66 were both ON) in the first sense leg 52 drops farther as the resistance $R_{1B}$ falls, as shown in the third graph of FIG. 3. The resistances $R_{2A}$, $R_{2B}$ of the antifuses 64 in the second sense leg 52 remain high, because the low second select signal $S_2$ keeps the second select transistor 54 OFF, isolating the corresponding antifuses 64 from ground. One skilled in the art will recognize that the blown or unblown state of the remaining antifuses 64 will be determined by the states of the remaining select signals $S_3 \ldots S_N$.

Once the selected antifuses 64 in the right fuse legs 58 are blown, the second isolation signal B returns low at time $t_6$. The programming input PA* goes high so that the switchable signal CGND returns to ground at time $t_7$, to prepare for testing of addresses or other data patterns. Then, at time $t_8$ all of the select signals $S_1$, $S_2 \ldots S_N$ return low, thereby isolating the test nodes 60 from ground.

During testing, both of the isolation signals A, B are high, as shown at time $t_9$. The high isolation signals A, B turn ON all of the isolation transistors 66 so that the left and right antifuses 64 in each of the sense legs 52 are coupled in parallel between the test node 60 and the switchable voltage CGND. The antifuses 64 provide parallel paths for the respective test nodes 60 to ground because the switchable voltage CGND is ground.

To read the address from the antifuse bank 48, the fuse read signal FRead goes high to turn ON the read transistors 63 at time $t_{10}$. The channel resistance of the PMOS biasing transistor 62 and the parallel resistance $R_{1A}\|R_{1B}$ of the antifuse pair form a voltage divider such that the voltage $V_N$ of the test node 60 will depend upon the relative resistances of the PMOS transistor channel and the antifuses 64, neglecting the channel resistances of the isolation transistors 66 and the reference transistor 70. If the resistance of the parallel antifuses 64 is sufficiently low, the node voltage $V_N$ will be below the threshold voltage of an output inverter 72 and the output of the sense leg 52 will be high. If the parallel resistance of the antifuses 64 is high, the test node voltage $V_N$ will be above the threshold voltage of the output inverter 72 and the output of the sense leg 52 will be low.

The outputs of the inverters 72 are then compared to bits of an incoming address at respective XOR gates 90. If one bit of the address does not match an inverter output, one of the XOR gate outputs will be high, indicating the incoming address does not match the programmed address of the antifuse bank 48. If the address bits match the inverter outputs exactly, all of the XOR gate outputs will be low. An output signal identifying whether or not the addresses match is then produced by combining the XOR gate outputs at a NOR gate 92. If all of the XOR gates 90 output low signals (i.e., all of the address bits match outputs of the output inverters 72), the NOR gate 92 will output a high detect signal DET that activates the corresponding redundant row or column of the memory array 43.

Figure 4:
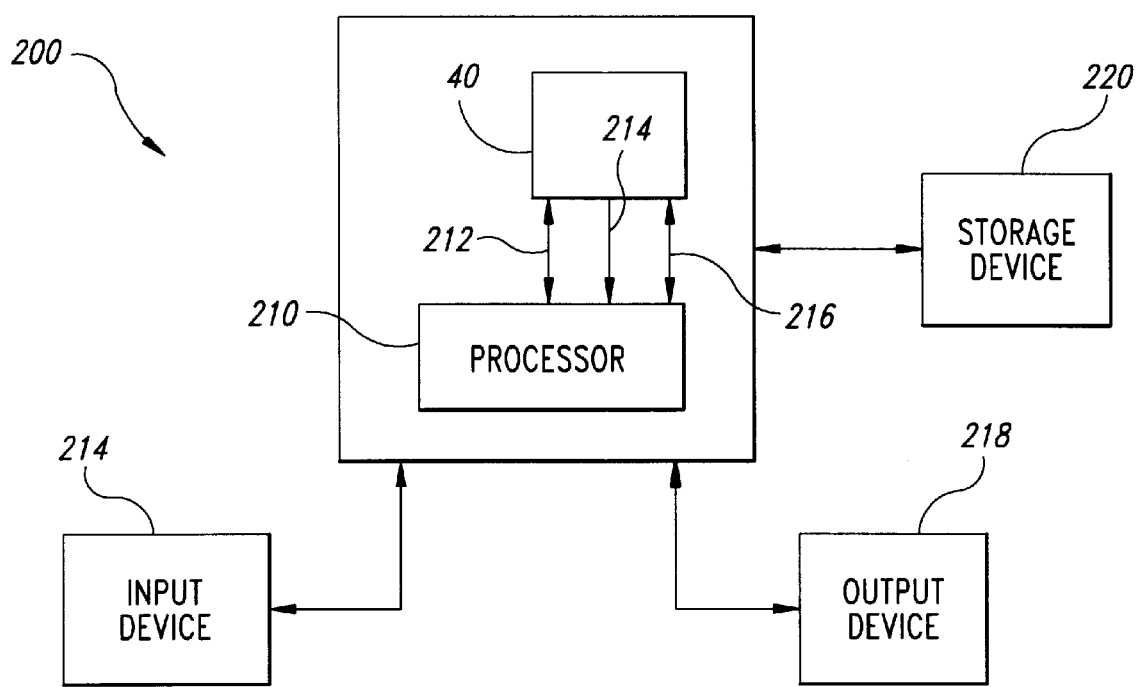
FIG. 4 is a block diagram of a computer system employing a memory device according to the embodiment of FIGS. 1 and 2.

FIG. 4 is a block diagram of a computer system 200 that uses the memory device 40 of FIG. 1. The computer system includes a processor 210 for performing computer functions, such as executing software to perform desired calculations and tasks. The processor 210 controls data flow into and out of the memory device 40 by providing addresses on an address bus 212, data on a data bus 214 and control commands, such as the isolation signals A, B, on a command bus 216. One or more input devices 214, such as a keypad or a mouse, are coupled to the processor 210 and allow an operator (not shown) to manually input data thereto. One or more output devices 218 are coupled to the processor 210 to provide to the operator data generated by the processor 210. Examples of output devices include a printer and a video display unit. One or more mass data storage devices 220 are preferably coupled to the processor 210 to store data in or retrieve data from the storage device 220. Examples of storage devices 220 include disk drives and compact disk read-only memories (CD-ROMs).

From the foregoing, it will be appreciated that, although specific embodiments of the invention have been described herein for purposes of illustration, various modifications may be made without deviating from the spirit and scope of the invention. For example, the exemplary embodiment described herein is a memory device 40. However, the antifuse circuit 46 may be incorporated in almost any device that would include a conventional antifuse circuit 46. Also, a variety of different circuit structures may be employed for the blowing circuit 50. Further, although each of the antifuse legs 58 in each of the sense legs 52 has been described herein as including a separate isolation transistor 66, a circuit wherein only one of the antifuse legs 58 includes an isolation transistor 66 may be within the scope of the invention. Such an embodiment would not be preferred because the antifuse leg 58 that lacked the isolation transistor 66 would not be isolated easily for independent blowing. However, in some applications, the elimination of one isolation transistor 66 and the circuitry to produce the second isolation signal B may be desirable. Moreover, although the antifuse circuit 46 has been described herein as an address detection circuit, the structures and concepts are equally applicable to many other types of antifuse circuits. Accordingly, the invention is not limited except as by the claims appended hereto.

We claim:

1. In a bit pattern detection circuit for identifying a selected bit pattern in a group of bits having a selected number of bits, a detecting circuit comprising a fuse set for each bit in the number of bits, each fuse set including a plurality of antifuses coupled in parallel between a respective test node and a respective reference node, each fuse set further including a first isolation switch serially coupled with a first of the antifuses in the plurality of antifuses, the first isolation switch having a first switching input adapted to receive a first isolation signal, the first isolation switch being responsive to the first isolation signal to selectively block current through the first antifuse.

2. The detecting circuit of claim 1, further comprising a plurality of selection circuits each coupled to a respective one of the reference nodes, each selection circuit having a switching input and responsive to a switching signal at the switching input to provide a current path between a reference potential and the respective reference node.

3. The detecting circuit of claim 1 wherein each of the fuse sets further includes a second isolation switch serially coupled with a second of the antifuses in the plurality of antifuses, the second isolation switch having second switching input adapted to receive a second isolation signal, the second isolation switch being responsive to the second isolation signal to selectively block current through the second antifuse.

4. The detecting circuit of claim 1, further comprising a sensing circuit coupled to the test node, the sensing circuit being responsive to provide an output voltage indicative of a resistance between the test node and the reference potential.

5. The detecting circuit of claim 4, further including a blowing circuit couplable to each of the fuse sets.

6. A sensing circuit for selectively providing a current path between a common node and a reference potential, comprising:

a first antifuse circuit including a first antifuse and a first isolation switch serially coupled between a test node and the common node, the first isolation switch having a first isolation input terminal adapted to receive a first isolation signal, the first isolation switch being responsive to block current flow in response to the first isolation signal at the first isolation input terminal;

a second antifuse circuit including a second antifuse, the second antifuse circuit being coupled in parallel with the first antifuse circuit between the test node and the common node;

a selection switch serially coupled to both the first and second antifuses coupled between the common node and a reference potential, the selection switch having a selection input adapted to receive a select signal indicating a programming state of the first and second antifuses, the selection switch being responsive to the select signal to provide a current path through the first and second antifuse circuits; and a first isolation signal source operative to provide the first isolation signal, the first isolation signal source having an isolation signal output coupled to the first isolation input terminal.

7. The sensing circuit of claim 6, further comprising a blowing circuit having a blowing output coupled to the common node and a programming control input terminal, the blowing circuit being operative to provide a blowing voltage sufficient to blow the first or second antifuses in response to a programming signal of the programming control input terminal.

8. The sensing circuit of claim 7 wherein the blowing circuit includes:

a blowing voltage source; and a switching circuit coupled between the common node and the blowing voltage source, the switching circuit having a switching input, the switching circuit being configured to provide a current path between the blowing voltage source and the common node in response to a programming signal of a first state at the switching input.

9. The sensing circuit of claim 6, further comprising a sensing circuit coupled to the test node, the sensing circuit providing a signal of a first state in response to a first resistance between the test node and the reference potential and providing a signal of a second state in response to a second resistance greater than the first resistance between the test node and the reference potential.

10. The sensing circuit of claim 9 wherein the blowing circuit includes a reference transistor coupled between the blowing output and the reference potential and configured to pull the blowing output to the reference potential in response to the programming signal of a second state different from the first state.

11. The sensing circuit of claim 6 wherein the second antifuse circuit includes a second isolation switch serially coupled to the second antifuse, the second isolation switch having a second isolation input terminal and being responsive to block current flow in response to a second isolation signal at the second isolation input terminal.

12. The sensing circuit of claim 11, further comprising a second isolation signal source operative to provide the second isolation signal, the second isolation signal source having an output coupled to the second isolation input terminal.

13. A computer system, comprising:

a processor;

an input device coupled to the processor;

an output device coupled to the processor;

an address bus coupled to the processor, the address bus being configured to supply addresses having a selected number of address bits;

a data bus coupled to the processor; and a memory device, including:
- an address input coupled to the address bus;
- a data input coupled to the data bus;
- a memory array coupled to the data bus and the address bus; and
- an address detection circuit coupled to the address input and the memory array, the address detection circuit including:
  - a plurality of test nodes;
  - a common node configured for coupling to a reference potential;
  - a plurality of fuse sets, each fuse set corresponding to a respective one of the address bits, each fuse set including a plurality of antifuses coupled in parallel between a respective test node and the common node, each fuse set further including a first isolation switch serially coupled to a first of the antifuses in the fuse set, each of the first isolation switches including a first control input and responsive to selectively block or pass current through the first antifuse in response to a first isolation signal at the first control input; and
  - a control node coupled to all of the first control inputs.

14. The computer system of claim 13 wherein each of the fuse sets further includes a second isolation switch serially coupled to a second of the antifuses in the antifuse set, each of the second antifuses including a second control input and responsive to selectively block or pass current through the second antifuse in response to a second isolation signal at the second control input.

15. The computer system of claim 13 wherein the address detection circuit includes a blowing circuit coupled to the common node and configured to selectively supply either a blowing voltage or the reference voltage to the common node.

16. The computer system of claim 13 wherein the address detection circuit further includes a plurality of monitoring circuits, each coupled to a respective one of the test nodes and each being responsive to detect a resistance between the respective test node and the common node.

17. The computer system of claim 13 wherein the address detection circuit includes a plurality of selection switches, each coupled between a respective test node and the reference potential.

18. A memory device, comprising:
- a memory array having a plurality of rows and columns, each row or column being identified by an address having a plurality of address bits;
- an address bus; and
- an address detection circuit, including:
  - a plurality of test nodes;
  - a common node configured for coupling to a reference potential;
  - a plurality of fuse sets each corresponding to a respective one of the address bits, each fuse set having an input terminal coupled to the common node and an output terminal coupled to a respective one of the test nodes, each fuse set including a first antifuse and a first isolation switch serially coupled between the respective input terminal and output terminal and a second antifuse coupled between the input terminal and output terminal, the first isolation switches each including a respective first switching input; and
  - a comparing circuit having a plurality of inputs coupled to the test nodes and a plurality of address bit inputs coupled to the address bus, the comparing circuit being configured to activate a selected row or column in response to a comparison of the test nodes to the address bit inputs.

19. The memory device of claim 18, further comprising a plurality of selection switches, each serially coupled with a respective fuse set between the common node and a respective test node.

20. The memory device of claim 18 wherein each of the fuse sets further includes a respective second isolation switch serially coupled with the second antifuse between the respective input terminal and output terminal.

21. The memory device of claim 18, further comprising a blowing circuit coupled between the common node and the reference potential, the blowing circuit including a blowing voltage source selectively couplable to the common node, the blowing voltage source providing a voltage sufficient to blow the antifuses.

22. A method of detecting a set of bits having a selected bit pattern, comprising the steps of:
- blowing at a first time selected antifuses in a first set of antifuses according to the selected bit pattern;
- blowing at a second time different than the first time selected antifuses in a second set of antifuses according to the selected bit pattern;
- coupling each of the antifuses in the first set of antifuses in parallel with a respective one of the antifuses in the second set of antifuses;
- producing a plurality of output signals, each corresponding to one of the pairs of parallel antifuses, each output signal having a logic state corresponding to the resistance of the pair of antifuses in parallel; and
- comparing each of the logic states to a respective bit of the selected bit pattern.

23. The method of claim 22 wherein the step of blowing selected antifuses in the first set of antifuses includes the steps of:
- applying a blowing voltage to a common node; and
- coupling the selected antifuses in the first set of antifuses between the common node and a reference potential.

24. The method of claim 23 wherein the step of blowing selected antifuses in the second set of antifuses includes the step of coupling the selected antifuses in the second set of antifuses between the common node and the reference potential.

25. The method of claim 24, further including the step of, before coupling the selected antifuses in the second set between the common node and the reference potential, blocking current flow through the antifuses in the first set of antifuses.

26. A method of blowing a fuse bank circuit having a common test node and a plurality of antifuses, each antifuse having a first terminal and a second terminal, comprising the steps of:
- coupling the first terminals to the common test node;
- coupling the second terminals in pairs to respective blowing nodes such that the antifuses are arranged in pairs with each pair sharing a single blowing node;
- applying a blowing voltage between selected ones of the blowing nodes and the common node;
- removing the blowing voltage; and
- after removing the blowing voltage, providing a current path through the antifuses to a reference potential.

27. The method of claim 26, further comprising the steps of:

before applying a blowing voltage to the respective blowing node, blocking current flow through a first antifuse in each pair;

after applying a blowing voltage to the respective blowing node, discontinuing blocking current flow through a first antifuse in each pair;

after discontinuing blocking current flow through a first antifuse in each pair, blocking current flow through a second antifuse in each pair; and after blocking current flow through a second antifuse in each pair, reapplying the blowing voltage to the respective blowing node.

* * * * *

UNITED STATES PATENT AND TRADEMARK OFFICE
CERTIFICATE OF CORRECTION

PATENT NO. : 5,923,672
DATED : July 13, 1999
INVENTOR(S) : Gordon D. Roberts; Jeffrey D. Bruce, Kurt D. Beigel and Eric T. Stubbs It is certified that error appears in the above-identified patent and that said Letters Patent is hereby corrected as shown below:

Column 5, line 9      reads, "to" should read -- $t_o$ --

Signed and Sealed this

Seventeenth Day of April, 2001

Attest:

NICHOLAS P. GODICI

Attesting Officer     Acting Director of the United States Patent and Trademark Office